(12) United States Patent
Brunner

(10) Patent No.: US 6,576,914 B2
(45) Date of Patent: *Jun. 10, 2003

(54) REDUNDANT PRINTING IN E-BEAM LITHOGRAPHY

(75) Inventor: Timothy A. Brunner, Ridgefield, CT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,840

(22) Filed: Jul. 30, 1999

(65) Prior Publication Data

US 2002/0125442 A1 Sep. 12, 2002

(51) Int. Cl.⁷ .................................................. H01J 37/04
(52) U.S. Cl. .............................. 250/492.23; 250/492.22
(58) Field of Search ....................... 250/492.22, 492.23, 250/492.2, 492.3

(56) References Cited

U.S. PATENT DOCUMENTS

| | | | | | |
|---|---|---|---|---|---|
| 5,557,110 | A | * | 9/1996 | Itoh | 250/492.23 |
| 5,874,198 | A | * | 2/1999 | Okino | 430/296 |
| 5,936,252 | A | * | 8/1999 | Stickel et al. | 250/492.23 |
| 6,262,429 | B1 | * | 7/2001 | Richton et al. | 250/492.23 |
| 6,323,500 | B1 | * | 11/2001 | Yamashita | 250/492.23 |

OTHER PUBLICATIONS

Elimiation of mask–induced defects with vote–taking lithography by C–C Fu, et al. in SPIE vol. 633 Optical Microlithography V (1986).

* cited by examiner

Primary Examiner—Kiet T. Nguyen
(74) Attorney, Agent, or Firm—Eric W. Petraske; Daryl K. Neff

(57) ABSTRACT

A stencil-scattering mask for e-beam lithography includes four complementary sub-field reticles, each of which is exposed with one fourth of the total dose. "Doughnut" stencil shapes have four different patterns of struts, so that an area that is blocked by a strut in one shape is exposed in three other shapes.

13 Claims, 6 Drawing Sheets

REDUNDANT PRINTING IN E-BEAM LITHOGRAPHY

TECHNICAL FIELD

The field of the invention is that of microlithographic patterning, especially using charged particle beam projection systems.

BACKGROUND OF THE INVENTION

In the field of lithography a reticle may contain stencil shapes, sometimes referred to as "doughnut" shapes, that are open areas having a "closed" configuration that permit the passage of the exposing radiation, but contain within them areas that are required to be opaque to the exposing radiation. A simple example is the letter "O", which has an closed oval line surrounding a central area. With chrome on glass masks, there is no problem in using such configurations, because the glass substrate supports the central opaque section. If such a shape is to be used in a particle beam system that employs a stencil reticle (a reticle having "opaque" regions that remove particle from the beam and open areas that permit the beam to pass though without scattering) there is the known problem of supporting the central area.

In the prior art, two complementary reticles were used to define stencil shapes, each reticle carrying a supported partial pattern that combined with the other pattern to define the correct shape, each reticle being exposed with the full exposure dose of electrons. Such reticles suffered from certain problems explained below.

SUMMARY OF THE INVENTION

The invention relates to a stencil mask for e-beam lithography that includes more than one set complementary subfield reticle, each of which is exposed with one nth of the total dose.

A feature of the invention is that stencil (or "doughnut") shapes have n different patterns of struts, so that an area that is blocked in one shape is exposed in (n−1) other shapes.

An advantageous feature of the invention is that, when used with a photoresist with sufficient contrast, the areas having (n−1)/n exposure are not significantly different from the areas having the full exposure.

Another feature of the invention is the provision of areas of the reticle that are used several times for printing repetitive arrays.

Yet another feature of the invention is the provision of areas of the reticle that carry alternative versions; i.e. the wafer can be exposed with version A or with version B.

DESCRIPTION OF THE PREFERRED EMBODIMENTS

Figure 1:
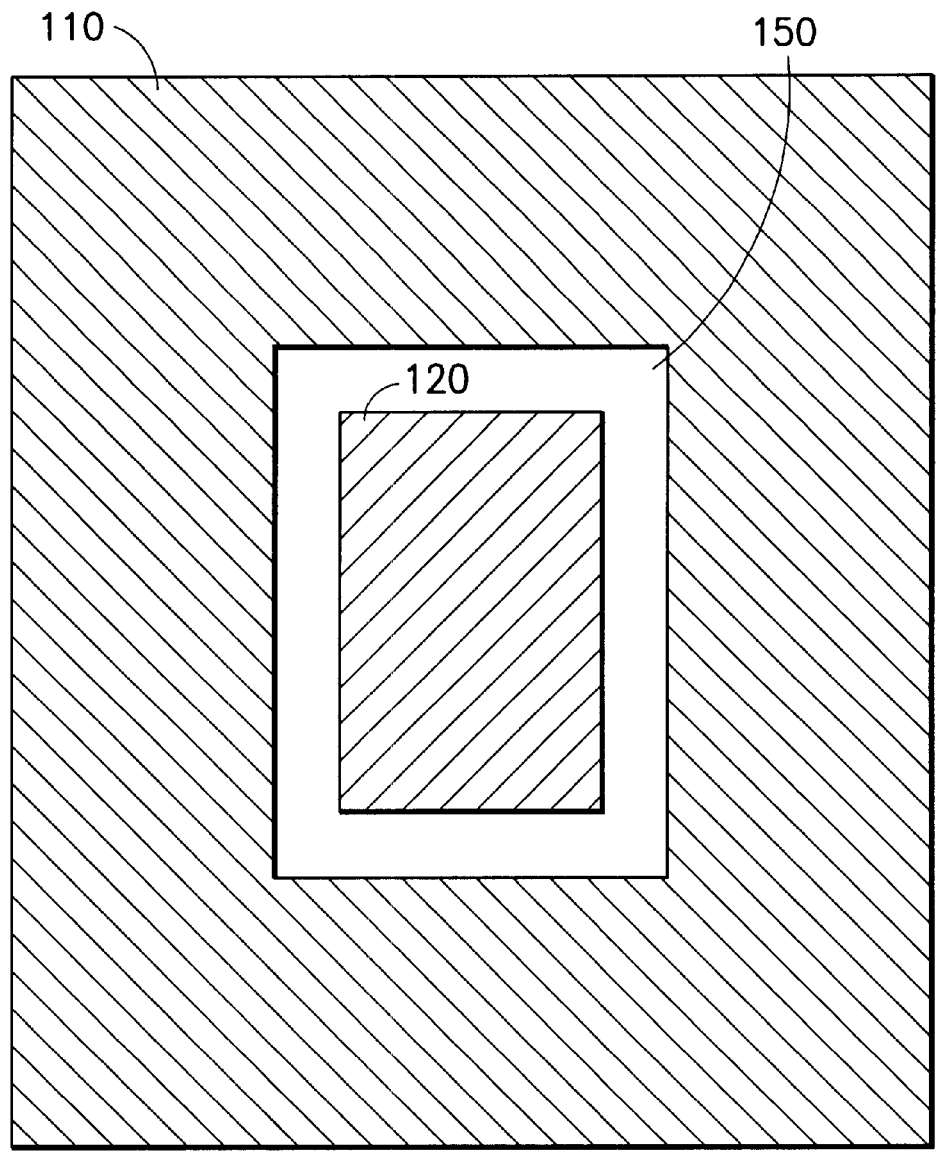
FIG. 1 illustrates a typical stencil pattern.

The problem of stencil shapes in particle beam lithography is an old one. It may be illustrated with respect to FIG. 1, showing a stencil shape in which a closed area (or closed curve) 150 that is meant to be exposed on the photoresist on a wafer surrounds central opaque area 120 that is not meant to be exposed and in turn is surrounded by blocking region 110. The problem, of course, is how to support area 120.

In photon optics using chrome on glass masks, the problem does not arise because the transparent substrate that supports the chrome in areas 110 and 120 also permits the photons to pass though area 150. In conventional particle beams systems, this is not the case and the counterpart of area 150 must be open. Referring now to FIG. 2, there is shown the conventional solution of complementary patterns in which shape 150 is made up of shapes 152 in FIG. 2a and shape 154 in FIG. 2b. These two shapes are formed in separate locations on the reticle and exposed in two separate exposures, each with the full exposure dose.

Figure 2A:
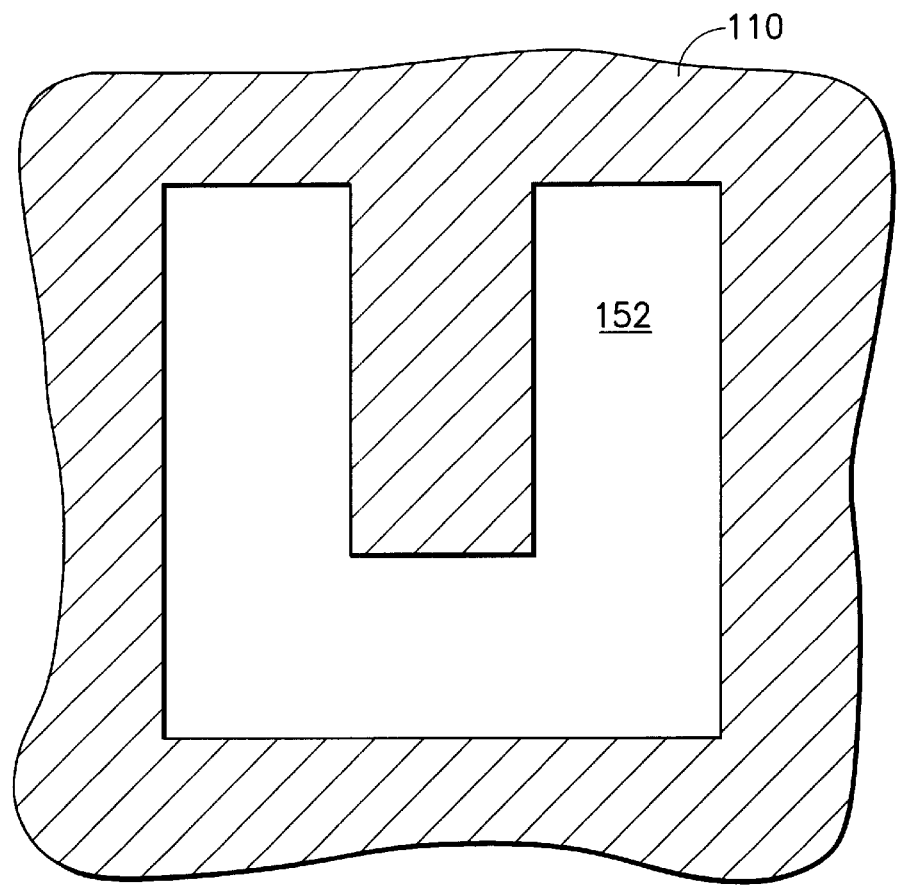
FIGS. 2a–2d illustrate the prior art solution and problems associated with it.
Figure 2B:
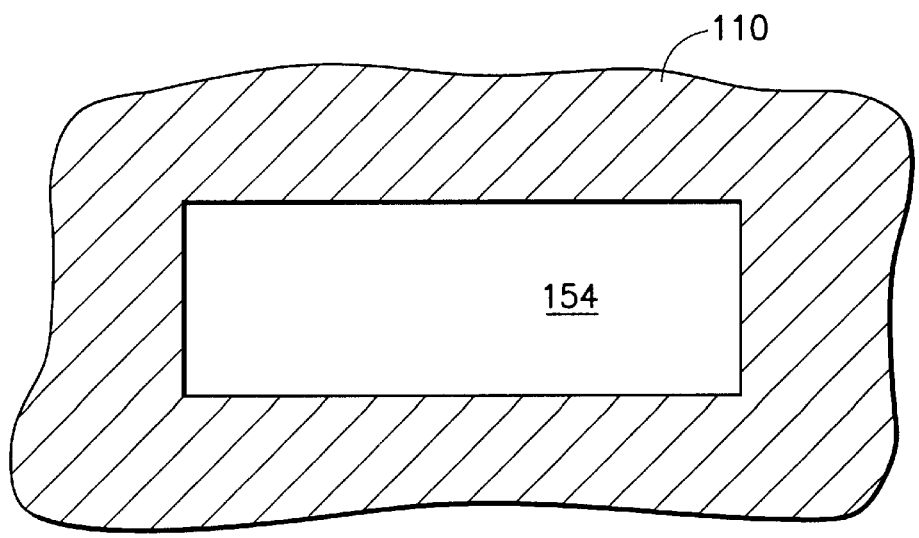
Figure 2C:
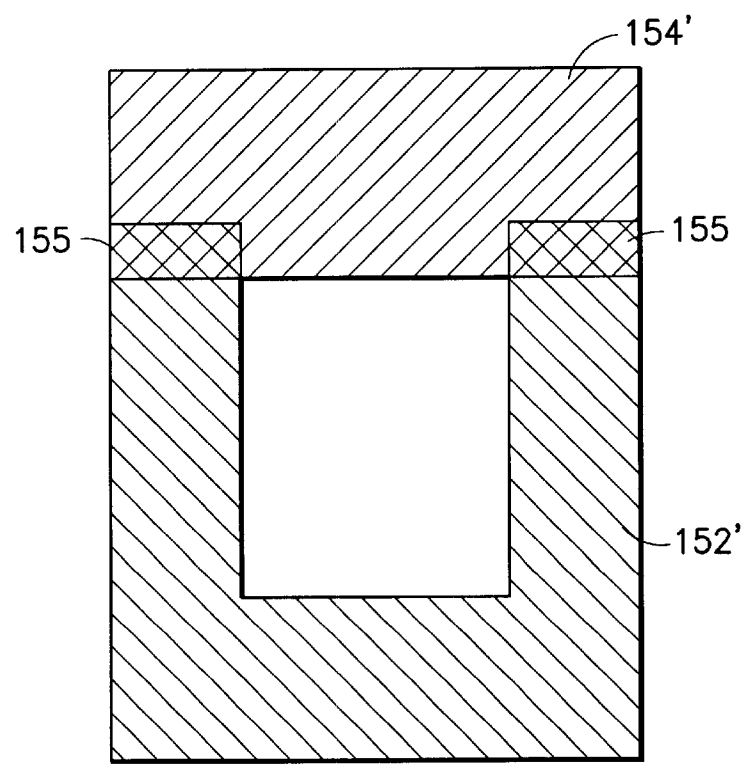
Figure 2D:
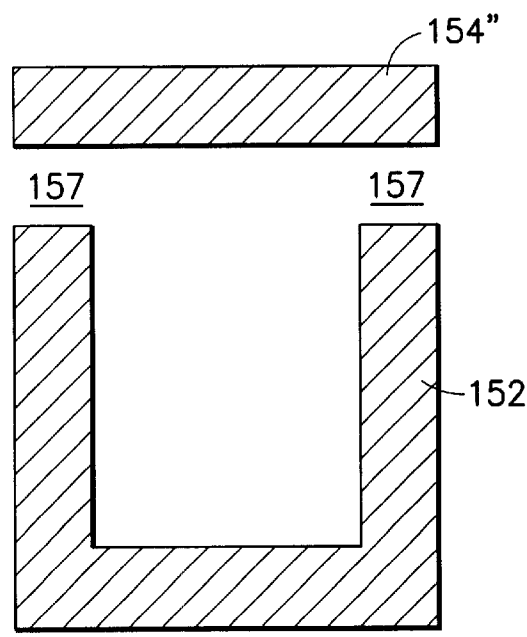

A problem that can arise with this approach is illustrated in FIGS. 2c and 2d. In FIG. 2c, the exposure dose (or the development parameters) has been too large and the "bias" is positive and the shapes 152' and 154' are larger than intended. There is thus an overlap in areas 155 where the exposure dose has caused the developed shape to bulge, as well as being too large in dimension. The other adverse situation is illustrated in FIG. 2d, in which the bias is negative, and not only are the shapes 152" and 154" too small but they do not connect and there is a gap at locations 157.

Not only does this complementary reticle approach take up more area than the prior art chrome on glass approach, but there is an additional problem with throughput. If the instantaneous current that can pass though the system is limited, the exposure time for the prior art approach in FIG. 2 is twice as long as the single-reticle approach in FIG. 1 (in addition to extra time allowed for moving the beam and settling time).

Figure 3:
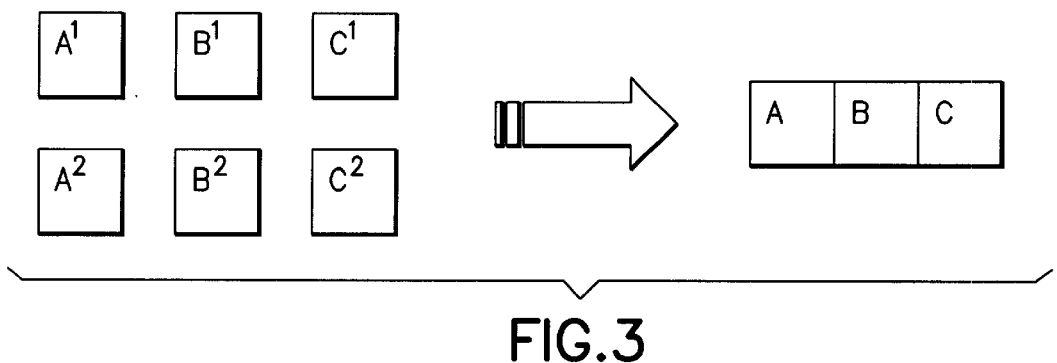
FIG. 3 illustrates the relationship between prior art complementary reticles and the exposed area of the wafer.

Referring now to FIG. 3, there is shown a prior art simplified example where, on the left, three subfield patterns A, B, and C (each illustratively 1 mm square) on a reticle are exposed, each with the full dose, and stitched together so that the images of subfields $A^1$ and $A^2$ are superimposed to form area A on the wafer. The same thing goes for subfields $B^1$ and $B^2$ and $C^1$ and $C^2$.

Figure 4:
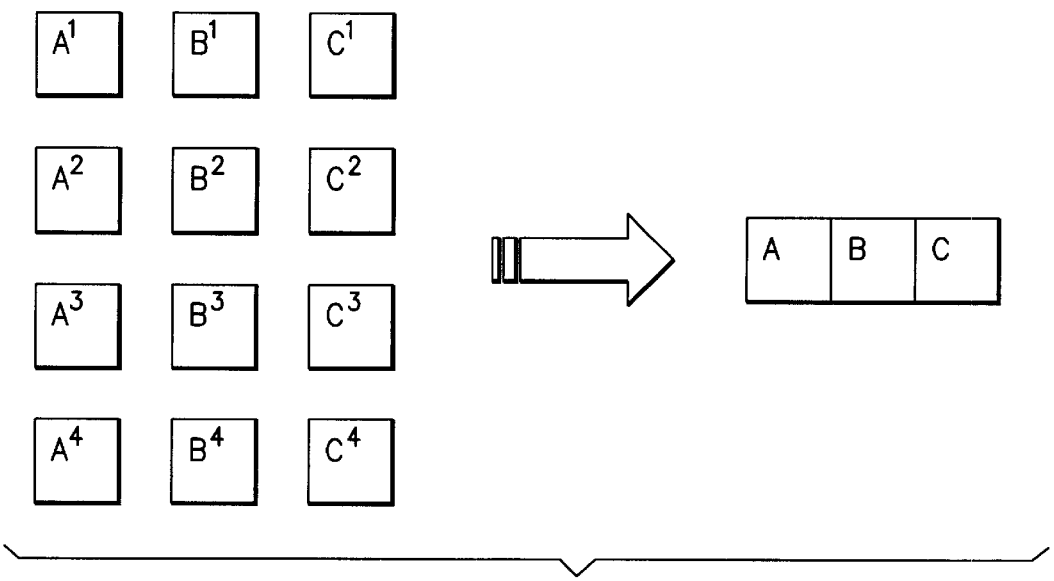
FIG. 4 illustrates a corresponding relationship according to the invention.
Figure 5A:
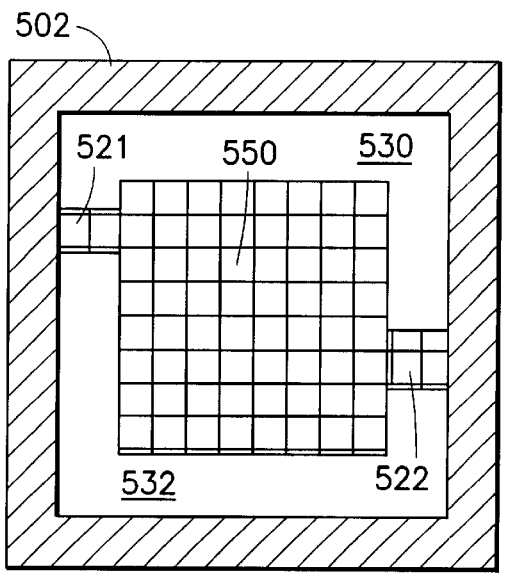
FIGS. 5a–5d illustrate a typical stencil area supported according to the invention.
Figure 5B:
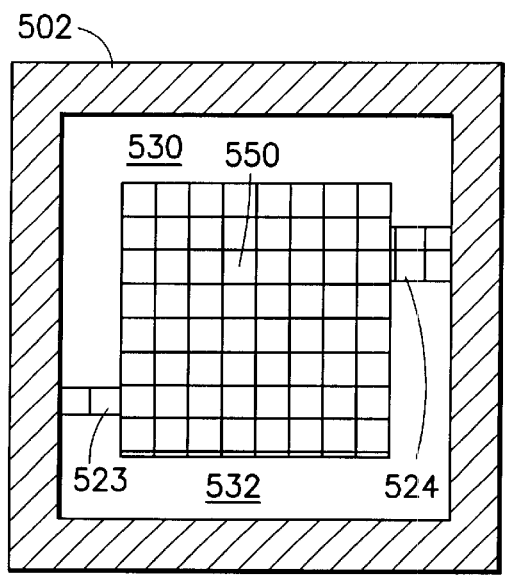
Figure 5C:
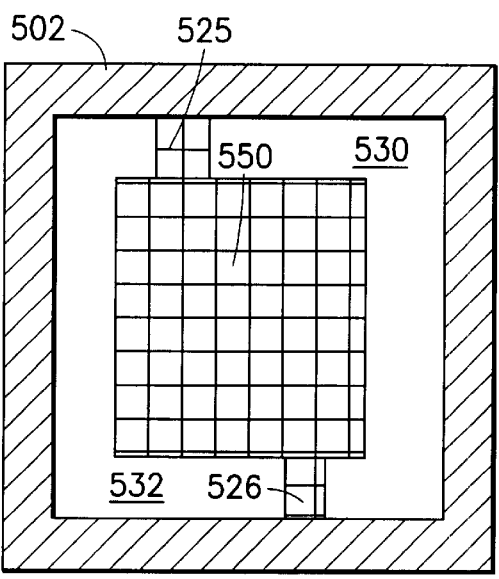
Figure 5D:
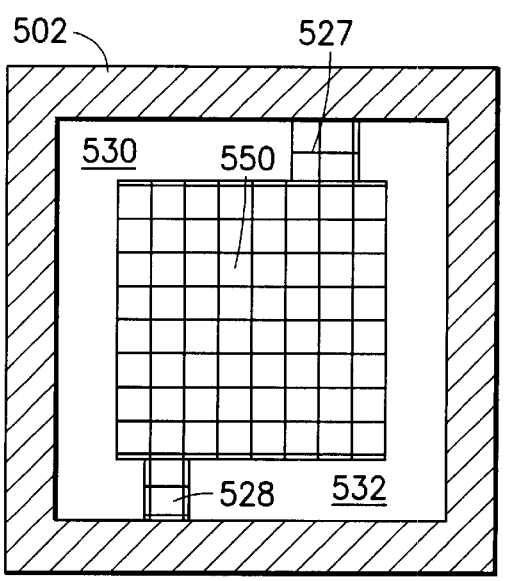

Referring now to FIG. 4, in the present invention, a group of four patterns $A^1$, $A^2$, $A^3$ and $A^4$ are all superimposed to form area A on the wafer; i.e. set A has four members. Each of the members is exposed with ¼ of the total dose. A, B and C form three sets, each having four subfields. The number of sets required for a reticle may vary greatly, being as low as one for a very small chip and being on the order of thousands for large chips. Thus, to clarify the terms used herein, if a pattern is represented by an array of 20×30 subfield patterns, then in a one-to-one reticle constructed according to the invention, there will be 600 sets, each having n members. If n=4, then there will be 2,400 subfields in the reticle. As will be discussed below, features of the invention can be used to reduce this number.

Referring now to FIG. 5, there is shown an example of the areas $A^1$, etc. In FIG. 5a, background blocking region 502 contains two open areas 530 and 532 that nearly surround central blocking region 550 that is supported by struts 521 and 522 near the upper left and lower right corners of region 550. Similarly, in FIG. 5b, struts 523 and 524 are near the lower left and upper right corners. In FIG. 5c, struts 525 and 526 are near the upper left and lower right corners. in FIG. 5d, struts 527 and 528 are near the upper right and lower left corners. The use of struts near diagonally opposite corners is preferred for stability, but not required.

Advantageously, when a photoresist having the correct contrast is used, the areas that are blocked by one of struts 521–528 and so receive only ¾ of the nominal dose are not significantly different from the fully exposed areas and the problems illustrated in FIGS. 2c and 2d are avoided. Similarly, if a misalignment or defect in one of the four patterns on the reticle leaves an area like area 157 in FIG. 2d, the effect is that of a strut in that area; i.e. no significant difference from a fully exposed area. Specifications for resist contrast may be derived according to an article *Elimination of mask-induced defects with vote-taking lithography* by C—C Fu, et al. in SPIE Vol. 633 Optical Microlithography V (1986), which address the problems of compensating for mask defects in Chrome on glass masks.

The throughput of wafers exposed with this technique is not necessarily half as much as that with the complementary reticle technique. A particle beam system will have a maximum instantaneous current that it will support (because of heat loading, mutual repulsion of the particles, etc.). If that maximum current is a limiting factor in the two-pattern technique, then the exposure time for each exposure in a four-pattern technique can be reduced. The following simple throughput model allows more quantitative comparisons of the prior art with the current invention. Let $T_{exp}$ be the full exposure time for a sub-field pattern, and let $T_{settle}$ be the time it takes to move from one sub-field pattern to the next. There fore the total time to expose a single sub-pattern would be $T_{single}=T_{exp}+T_{settle}$. In the prior art method, two complementary sub-field patterns must be exposed to build a single complete sub-field pattern on the wafer, and so the total time is $T_{comp}=2(T_{exp}+T_{settle})=2T_{single}$, or double the previous time. In one form of the current invention, four sub-field patterns would be exposed, each with ¼ the normal exposure time, or a total time of $T_{now}=(T_{exp}+4T_{settle})$. Therefore, we can see that the relative throughput of the present invention to the prior art complementary exposure throughput is dependent on the ratio $T_{settle}/T_{exp}$. The ratio $T_{new}/T_{comp}=(1+4t)/(2+2t)$. In the limit where t is much smaller than 1, the new invention will be twice as fast as the prior art complementary approach. In the limit where t is very large, the new invention will be half as fast as the prior art. For a given particle beam exposure system with given $T_{exp}$ and $T_{settle}$, we can clearly understand the throughput implications of various exposure strategies. In one case, t=0.76 and the ratio $T_{new}/T_{comp}=1.15$.

An optional feature of the invention is that repeated patterns can easily be used on a one to many basis. For example, if a circuit requires 20 4-input NAND gates, a single set of four patterns (NAND[1], etc.) could be used for them all. The reticle designer will have to consider whether it is preferable in any particular case to use more than one set of patterns if the use of a single set would require too much time spent moving a mechanical stage.

In addition, memory arrays lend themselves readily to the present invention, since the extra area on the reticle required by the use of four rather than two sets of patterns, is more than compensated by the space saved by re-using a single set of four patterns. In the particular case of a projection lithography system employing a 4:1 reduction ratio and 0.25 μm ground rules, it is possible to fit approximately 50,000 DRAM memory cells on a subfield. A module of this size can be repeated as often as necessary to meet the customer's requirements.

In current technology, roughly 80% of a DRAM is consumed by the array of cells. SRAMs, flash memory, and other chips having arrays of identical elements also lend themselves to the use of a one-to-many approach. Similarly, some microprocessors have as much as 60% of their area devoted to SRAM caches.

Another feature of the invention is that space saved by re-using a set of subfields many times can be used to add redundant sets of one-to-one subfields (each subfield is exposed once). It is a considerable advantage of the present invention that an imperfect mask can still make perfect chips, but not all imperfections can be compensated. Another feature of the invention is that redundant sets of one-to-one subfields can be placed on the reticle, so that if a defect cannot be averaged out by multiple exposures, a redundant subfield or set of subfields can be used, thus salvaging the reticle. Another feature of the invention is that a reticle can be constructed with two or more alternate groups of subfield sets. For example, suppose that a manufacturer wants to make available a memory chip with alternate forms of output (e.g. by eight and by sixteen, say) and that the number of patterns to be superimposed is four. A reticle could be made having two versions of the output circuitry and one or the other would be used for any given chip. On the reticle there would be an m×4 array, where m is the number of subfields required to define the output circuitry. Both output versions could be formed on the same wafer, in the case of prototypes or other small production runs.

Figure 6:
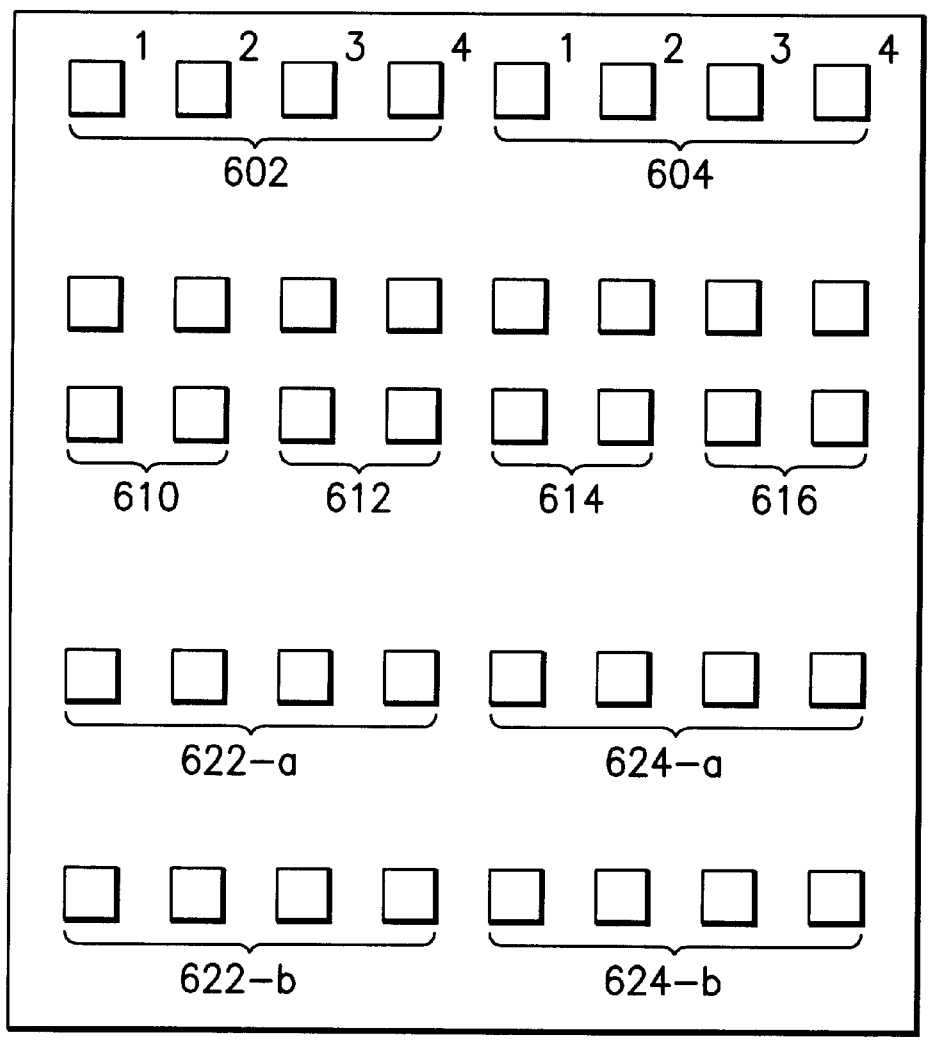
FIG. 6 illustrates a reticle employing redundant subfields.

Referring now to FIG. 6, there is shown a simplified version of a reticle 600 having these characteristics. At the top of reticle 600, two groups of four subfields 602 and 604 represent schematically redundant versions of a one-to-one subfield pattern. In this example, the feature can be contained in a single subfield, so only one set of four members is needed. If set 602 is defective at the start or becomes contaminated in use, then set 604 can be substituted.

In the center of reticle 600, there are shown four duplicate sets of a one-to-many subfield pattern, 610, 612, 614 and 616. Again, each set has four members. Set 610, for example, represents a module in a memory array. It can be repeated as often as required to fill in the desired number of cells. Sets 612, 614 and 616 are redundant copies available if needed. All four sets could be used in sequence to give time for charge to dissipate or heat to dissipate, if either is a concern in any particular chip. No particular arrangement on the reticle is required and it is a design choice to use a linear layout as in 602 and 604 or the more compact layout of 610, etc.

At the bottom of reticle 600, there are shown two alternative sets of subfields, 622-a and 624-a. One or the other of these sets of subfields may be used to place an optional feature (622) or (624) on the chip (e.g. different numbers of bits in the output). Redundant subfield sets 622-b and 624-b are shown below that may be used in the same manner as the redundant sets shown in the upper portion of the reticle.

Those skilled in the art will realize from the description above that the invention be practiced with three sets of patterns, five sets or more, though four is the preferred embodiment.

In the following claims, "blocking" is used generally to include reticles using scattering to pattern the beam (e.g. the PREVAIL approach developed by IBM in which scattered electrons are removed downstream, so that the heat load on the reticle is reduced), in addition to absorbing the beam particles; i.e. blocking means both absorbing and scattering. The invention can also be practiced with non-stencil differential scattering masks, such as the SCALPEL mask approach (J. A. Liddle et al., *"The Scattering with Angular Limitation in Projection Electron-Beam Lithography*

(*SCALPEL*) *System*", Jpn. J. Appl. Phys. 4 p6663 (1995). Also, reticles according to the invention are not restricted to electron beams and may be used with other particle beams.

While the invention has been described in terms of a single preferred embodiment, those skilled in the art will recognize that the invention can be practiced in various versions within the spirit and scope of the following claims.

I claim:

1. A stencil reticle for a projection particle beam lithography system comprising:
    more than one set of subfields, for use with the same type of resist, formed from a blocking material and collectively representing a pattern of a layer of an integrated circuit, said pattern including at least one closed area in which a central blocking area that is not to be exposed on a wafer and is surrounded by an open area that is to be exposed, said open area being disposed within a blocking region; in which
    at least one set of said more than one set of subfields includes n subfields, where n is an integer greater than one, each having a central blocking portion of said blocking material attached to a blocking region of said blocking material by at least two supporting struts of said blocking material, each subfield further being exposed by one nth of an exposing dose of particles; and
    in each said subfield of said n subfields, said at least two supporting struts being located in different locations of said open area relative to each other of said n subfields, whereby each of said struts blocks only one nth of said exposing dose of particles.

2. A reticle according to claim 1, in which said blocking material absorbs particles incident on it.

3. A reticle according to claim 2, in which n equals four.

4. A reticle according to claim 1, in which said blocking material scatters particles incident on it.

5. A reticle according to claim 4, in which n equals four.

6. A reticle according to claim 1, in which n equals four.

7. A reticle for a projection particle lithography system comprising:
    more than one set of subfields, for use with the same type of resist, formed from a blocking material and collectively representing a pattern of a layer of an integrated circuit, in which;
    a fist set of said more than one set of subfields represents a first portion of said pattern on a one-to-one basis, whereby each subfield of said first subset is exposed once;
    a second set of said subfields having n members represents a second portion of said pattern on a one-to-many basis, whereby each subfield of said second set is exposed by a one nth exposing dose of particles; each subfield of said second set including a central blocking portion of said blocking material attached to a blocking region of said blocking material by at least two supporting struts of said blocking material, and an open area between said central blocking portion and said blocking region; and
    in each of said n subfields of said second set, said at least two supporting struts being located in different locations of said open area relative to each other subfield of said second set, whereby each of said struts blocks only one nth of an exposing dose of particles.

8. A reticle for a projection particle lithography system according to claim 7, further comprising:
    at least one duplicate set of subfields that duplicates said second set of subfields.

9. A reticle for a projection particle lithography system according to claim 7, further comprising:
    at least one duplicate set of subfields that duplicates said at least a portion of said first set of subfields.

10. A reticle for a projection particle lithography system according to claim 7, further comprising:
    at least one duplicate set of subfields that duplicates each of said first set of subfields.

11. A reticle for a projection particle lithography system according to claim 7, further comprising:
    at least one alternative set comprising m sets of subfields that substitutes for m sets of said first set of subfields, whereby said reticle contains two versions of said in sets of subfields.

12. A reticle for a projection particle lithography system according to claim 7, further comprising:
    at least one alternative set of subfields that substitutes for said second set of subfields.

13. A reticle for a projection particle lithography system according to claim 7, further comprising:
    at least one alternative set of subfields that substitutes for at least a portion of said first set of subfields.

* * * * *